(12) United States Patent  (10) Patent No.: US 8,922,990 B1
Tanner  (45) Date of Patent: Dec. 30, 2014

(54) ACTIVE COOLING FIN PACK

(75) Inventor: James Tanner, Los Gatos, CA (US)

(73) Assignee: Google Inc., Mountain View, CA (US)

( * ) Notice: Subject to any disclaimer, the term of this patent is extended or adjusted under 35 U.S.C. 154(b) by 66 days.

(21) Appl. No.: 13/438,293

(22) Filed: Apr. 3, 2012

(51) Int. Cl.
H05K 7/20 (2006.01)

(52) U.S. Cl.
CPC ........ *H05K 7/20145* (2013.01); *H05K 7/20154* (2013.01)
USPC ................. 361/679.47; 361/697; 361/679.49; 165/80.3; 165/104.33; 165/121

(58) Field of Classification Search
USPC .......................... 165/80.3, 122, 185; 361/697
See application file for complete search history.

(56) References Cited

U.S. PATENT DOCUMENTS

| | | | | |
|---|---|---|---|---|
| 5,630,469 A | * | 5/1997 | Butterbaugh et al. | 165/80.3 |
| 5,653,285 A | * | 8/1997 | Lee | 165/185 |
| 5,957,194 A | * | 9/1999 | Azar | 165/80.3 |
| 6,104,609 A | * | 8/2000 | Chen | 361/695 |
| 6,348,748 B1 | * | 2/2002 | Yamamoto | 310/62 |
| 6,678,158 B2 | * | 1/2004 | Li et al. | 361/697 |
| 6,681,845 B1 | * | 1/2004 | Yeh et al. | 165/122 |
| 7,532,468 B2 | * | 5/2009 | Sun et al. | 361/690 |
| 7,688,587 B2 | * | 3/2010 | Ishikawa | 361/695 |
| 7,948,750 B2 | * | 5/2011 | Hung et al. | 361/679.47 |
| 2002/0167798 A1 | * | 11/2002 | Jui-Yuan | 361/697 |
| 2002/0181200 A1 | * | 12/2002 | Chang | 361/687 |
| 2003/0016495 A1 | * | 1/2003 | Hongo | 361/687 |
| 2004/0001316 A1 | * | 1/2004 | Kamikawa et al. | 361/700 |

* cited by examiner

*Primary Examiner* — Allen Flanigan
(74) *Attorney, Agent, or Firm* — Lerner, David, Littenberg, Krumholz & Mentlik, LLP

(57) ABSTRACT

Aspects of the disclosure relate generally to active cooling or removing heat generated by a processor in a computing device. More specifically, a cooling system in a computing device may include a heatpipe which moves the heat through a fin pack and out an exhaust vent. The fin packs described herein may include a blade at the exit end of the fin pack. The blade is oriented between the end wall of a computing device and the exit of the fin pack. The blade both keeps the air creating hot spots at the surface of the computing device and provides additional surface area for moving heat away from the heat pipe. The blade may have different configurations, for example, a generally rectangular shape or an arced-shape.

8 Claims, 16 Drawing Sheets

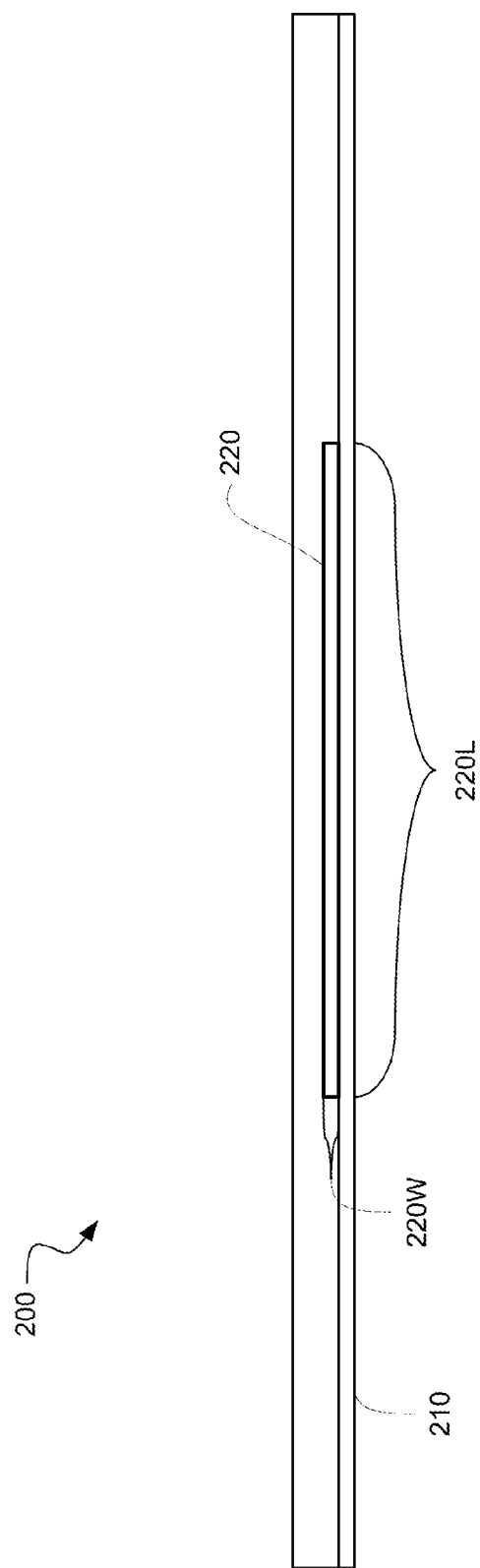

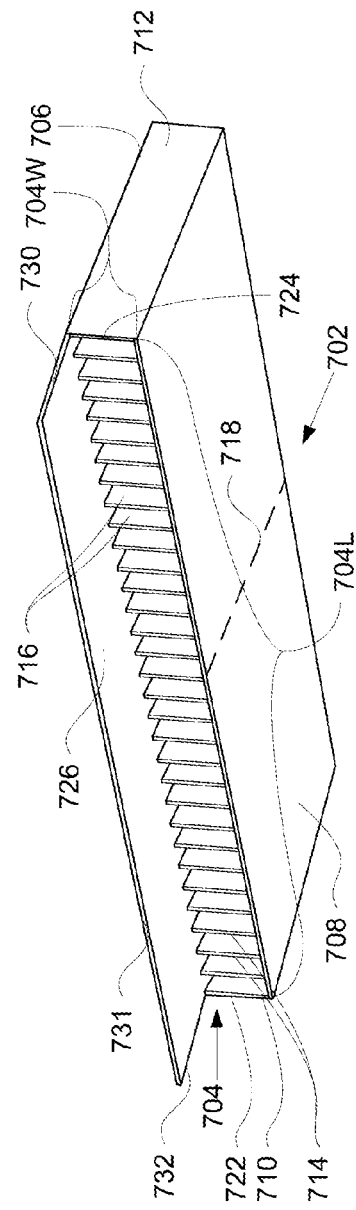
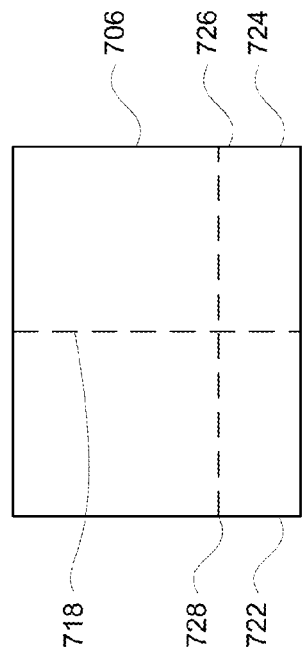
FIGURE 7A
FIGURE 7B

ACTIVE COOLING FIN PACK

BACKGROUND

In a typical computing device, a processor and other components can generate significant amount of heat. In order to remove this heat from the device, it is transported through a heatpipe into a fin pack. A fan blows air through the fin pack in order to force the heat through an exhaust vent and out of the computing device. As computing devices become thinner and thinner, the exhaust vents have also become narrower due to the fact that there is less surface area available and to make exhaust vents aesthetically pleasing. This may result in a configuration where the usable area of the exhaust vent, for example, that area of the exhaust vent which is in line with an exit of a fin pack, is smaller than the area of the exit of the fin pack. In order to move the same amount of heated air through a smaller exhaust vent, the fan speed must be increased. This may require additional power and cause the fan to create more noise.

To address this problem, the fin pack may be moved away from the exhaust vent in order to create an open space between the fin pack and the exhaust vent. However, once the fin pack is moved away from the exhaust vent, the open space may cause a hot spot on the surface of the device from heated air moving around between the fin pack and the exhaust vent. In the past, the computing devices have included insulators at such hot spots or a heat spreader, such as a graphite sheet, in order to disperse the heat from the hot spot. These options are less efficient and may still result in hot spots.

SUMMARY

One aspect of the disclosure provides A fin pack for expelling heat from a computing device. The fin pack comprises a housing having four sidewalls. The four sidewalls include a first sidewall opposite a second sidewall, a third sidewall between the first and second sidewalls, the third sidewall being opposite a fourth sidewall, the fourth sidewall between the first and second sidewalls. The fin pack also includes a set of fins extending from the first sidewall towards the second sidewall. The set of fins is arranged between the third and fourth sidewalls. The fin pack includes an entrance at a first end of the housing and an exit at a second end of the housing opposite the entrance. The fins begin at the entrance and terminate at the exit such that during operation of the fin pack, air flows into the fin pack at the entrance, through the fins, and out of the fin pack at the exit. The fin pack includes a blade extending from the first sidewall past the exit. The blade has a generally rectangular shape with three exposed edges all in a same plane as at least part of the first sidewall.

In one example, the blade is in a plane that is generally perpendicular to a plane of a fin of the fin pack. In another example, the blade extends at least 1 mm past the exit of the fin pack. In yet another, two of the exposed edges are parallel, a first one of the parallel exposed edges does not extend past a plane of the third sidewall, and a second one of the parallel exposed edges does not extend past a plane of the fourth sidewall.

Another aspect of the disclosure provides a fin pack for expelling heat from a computing device. The fin pack comprises a housing having four sidewalls. The four sidewalls include a first sidewall opposite a second sidewall, a third sidewall between the first and second sidewalls, the third sidewall being opposite a fourth sidewall, the fourth sidewall between the first and second sidewalls. The fin pack also includes a set of fins extending from the first sidewall towards the second sidewall. The set of fins is arranged between the third and fourth sidewalls. The fin pack also includes an entrance at a first end of the housing and an exit at a second end of the housing opposite the entrance. The fins begin at the entrance and terminate at the exit such that during operation of the fin pack, air flows into the fin pack at the entrance, through the fins, and out of the fin pack at the exit. The fin pack also includes a blade extending from the first sidewall past the exit. The blade has a generally arced shape with an exposed edge in a same plane as at least part of the first sidewall.

In one example, the blade is in a plane that is generally perpendicular to a plane of a fin of the fin pack. In another example, an apex of the blade extends at least 1 mm past the exit of the fin pack. In yet another example, the edge of the blade does not extend past a plane of the third sidewall, and the edge of the blade does not extend past a plane of the fourth sidewall.

A further aspect of the disclosure provides a device. The device includes a device housing having a top wall and an end wall adjacent to the top wall. The end wall includes an exhaust vent for allowing exhaust air to leave the housing. The fin pack includes a fin pack housing having four sidewalls. The four sidewalls include a first sidewall opposite a second sidewall, a third sidewall between the first and second sidewalls, the third sidewall being opposite a fourth sidewall, the fourth sidewall between the first and second sidewalls. The fin pack also includes a set of fins extending from the first sidewall towards the second sidewall. The set of fins is arranged between the third and fourth sidewalls. The fin pack also includes an entrance at a first end of the fin pack housing and an exit at a second end of the housing opposite the entrance. The exit is oriented towards the exhaust vent and spaced a pre-determined distance from the exhaust vent. The fins begin at the entrance and terminate at the exit such that during operation of the fin pack, air flows into the fin pack at the entrance, through the fins, and out of the fin pack at the exit. The fin pack also includes a blade extending from the first sidewall past the exit and towards the exhaust vent. The blade has a generally rectangular shape with three exposed edges all in a same plane as at least part of the first sidewall. The fin pack is positioned in the device housing to allow heat generated by a processor to move through the fin pack from the entrance through the fins and out the exit. The blade is configured to prevent a hot spot from forming on the top wall along a second plane through a center line of the fin pack.

In one example, the blade is in a third plane that is generally perpendicular to a fourth plane of a fin of the fin pack. In another example, two of the exposed edges are parallel, a first one of the parallel exposed edges does not extend past a plane of the third sidewall, and a second one of the parallel exposed edges does not extend past a plane of the fourth sidewall. In yet another example, the first and second sidewalls are each associated with respective outer edges, and the pre-determined distance from the exhaust vent is such that an equation, $a+b \geq c$ is satisfied. In this example, a is a usable cross sectional area of the exhaust vent determined based on an overlapping area of the exhaust vent and the fin pack if the fin pack was moved towards the exhaust vent until the fin pack was against the exhaust vent and the end wall, b is the cross sectional areas of the openings in the device housing between the end wall and each of the respective outer edges, and c is a total cross sectional area of the exhaust openings through which air flows at the exit.

In one example, the blade is configured to provide additional surface area for distributing the heat to air blown through the exit of the fin pack. In another example, the fin pack is arranged in the housing such that there is a gap of at least 0.5 mm between one of the exposed edges of the blade and the end wall.

Still a further aspect of the disclosure provides a device. The device includes a device housing having a top wall and an end wall adjacent to the top surface, the end wall including an exhaust vent for allowing exhaust air to leave the housing. The device also includes a fin pack including a fin pack housing having four sidewalls. The four sidewalls include a first sidewall opposite a second sidewall, a third sidewall between the first and second sidewalls, the third sidewall being opposite a fourth sidewall, the fourth sidewall between the first and second sidewalls. The fin pack includes a set of fins extending from the first sidewall towards the second sidewall, the set of fins being arranged between the third and fourth sidewalls. The fin pack also includes an entrance at a first end of the fin pack housing and an exit at a second end of the housing opposite the entrance. The exit is oriented towards the exhaust vent and spaced a pre-determined distance from the exhaust vent. The fins begin at the entrance and terminate at the exit such that during operation of the fin pack, air flows into the fin pack at the entrance, through the fins, and out of the fin pack at the exit. The fin pack also includes a blade extending from the first sidewall past the exit and towards the exhaust vent. The blade has a generally arced shape with an exposed edge in a same plane as at least part of the first sidewall. The fin pack is positioned in the device housing to allow heat generated by a processor to move through the fin pack from the entrance through the fins and out the exit. The blade is configured to prevent a hot spot from forming on the top wall along a second plane through a center line of the fin pack.

In one example, the blade is in a third plane that is generally perpendicular to a fourth plane of a fin of the fin pack. In another example, the edge of the blade does not extend past a plane of the third sidewall, and the edge of the blade does not extend past a plane of the fourth sidewall. In yet another example, the first and second sidewalls are each associated with respective outer edges, and the pre-determined distance from the exhaust vent is such that an equation, $a+b \geq c$ is satisfied. In this example, a is a usable cross sectional area of the exhaust vent determined based on an overlapping area of the exhaust vent and the fin pack if the fin pack was moved towards the exhaust vent until the fin pack was against the exhaust vent and the end wall, b is the cross sectional areas of the openings in the device housing between the end wall and each of the respective outer edges, and c is a total cross sectional area of the exhaust openings through which air flows at the exit. In another example, the blade is configured to provide additional surface area for distributing the heat to air blown through the exit of the fin pack. In yet another example, the fin pack is arranged in the housing such that there is a gap of at least 0.5 mm between the exposed edge of the blade and the end wall.

BRIEF DESCRIPTION OF THE DRAWINGS

FIG. 2 is a view of an end wall of an example computing device in accordance with aspects of the disclosure.
FIGS. 7A and 7B are example diagrams of a fin pack in accordance with aspects of the disclosure.

DETAILED DESCRIPTION

Figure 1A:
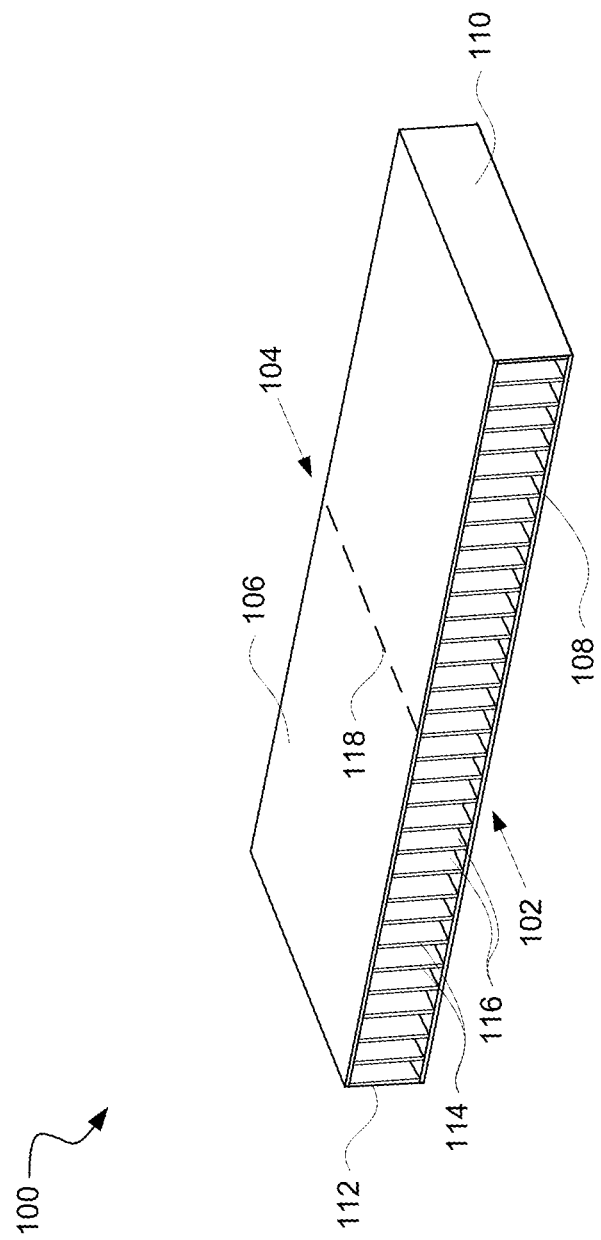
FIG. 1A is an example diagram of a fin pack of the prior art.

Aspects of the disclosure relate generally to active cooling or removing heat generated by a processor in a computing device. In a typical mobile computing device, such as a laptop computer, heat is transferred through a heat pipe and into a fin pack. Fin pack 100 of FIG. 1A is an example of a typical fin pack. The fin pack includes a housing having a front end 102, a back end 104 (opposite of the first end), a top wall 106, a bottom wall 108, a first sidewall 110, and a second sidewall 112 (opposite of the first sidewall). The fin pack also includes a plurality of fins 114 and spaces 116 between the fins (and at each corner of the front end, between the fins and the sidewalls). Line 118 is a reference line (not necessarily present in the fin pack) depicting the center of fin pack 100.

Figure 1B:
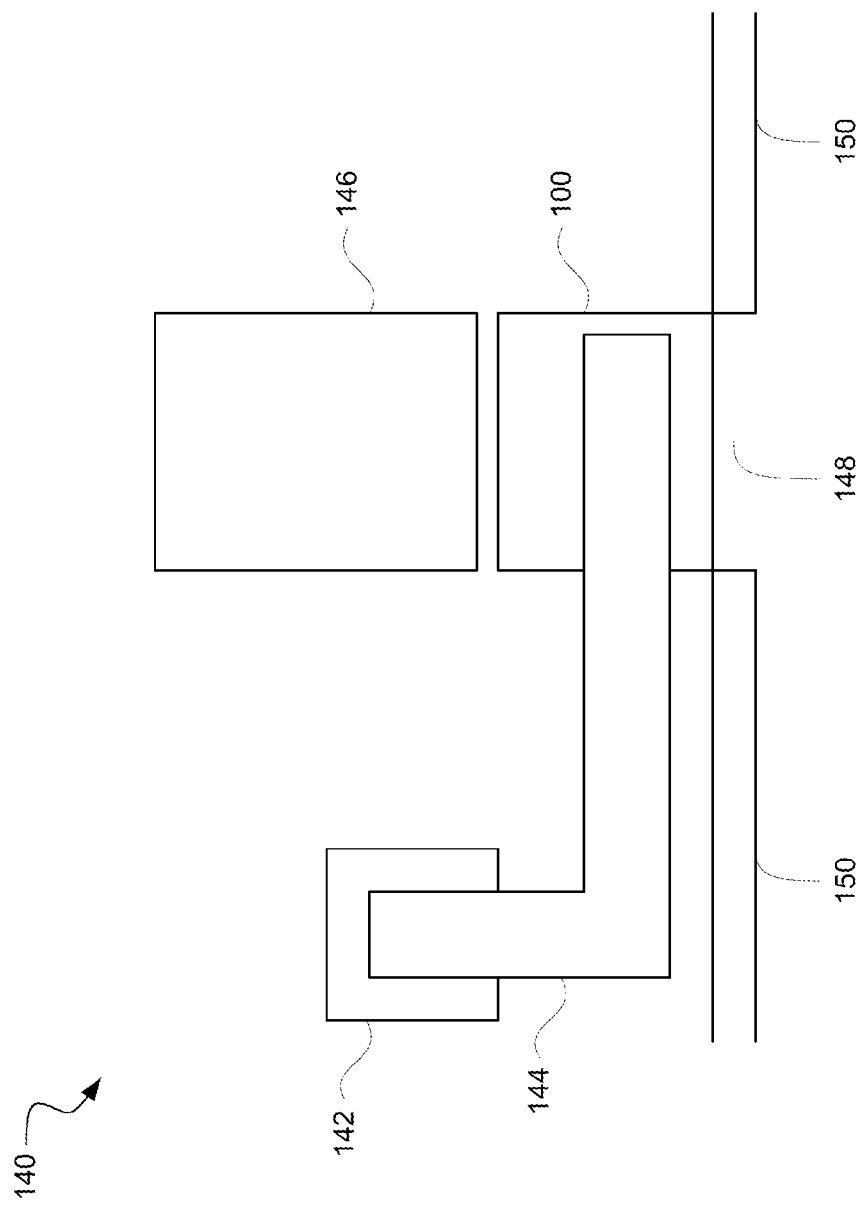
FIG. 1B is a top down partial cross sectional view of a computing device of the prior art.

FIG. 1B is a top down partial cross sectional view of a computing device 140 having a processor 142, a heat pipe 144, a fan 146, and fin pack 100. Processor 142 may actually include one or more processors depending upon the arrangement of the features of computing device 140.

As described above, during operation, processor 142 generates heat. This heat is transferred to the fin pack 100 via the heat pipe 144. The heat pipe may be adjacent to and may contact the fin pack so that heat from the heat pipe is conducted down the fins 114 (of FIG. 1A). The fan 146 may blow air through the fin pack from the front end 102 through the spaces 116 between the fins 114, and out the back end 104. As the air moves through the fin pack, the air collects heat from the fins. The heated air then exits the computing device 140 through an exhaust vent 148 in end wall 150 of the computing device. In order to efficiently move heat through the fin pack and out of the exhaust vent, in this example, the fin pack is lined up with the exhaust vent and the length, width, and cross sectional area of the exhaust vent typically is greater than or equal to the length, width, and cross sectional area of the fin pack and the spaces 116 of the fin pack.

FIG. 2 depicts an example of an end wall 210 of a computing device 200 having a relatively narrow exhaust vent 220. The computing device 200 (and computing devices 800 and 1000 described below) may include various mobile computing devices such as a cellular phone, tablet PC, netbook, laptop computer, e-book reader, or other such devices with a relatively thin profile, for example a few centimeters or less. In this example, the end wall 210 may correspond to an end wall of a housing for any of the mobile computing devices described above. For example, if computing device 200 includes a two part housing (such as a laptop with a monitor portion and a keyboard portion), end wall 210 may correspond to that portion of the housing which houses the fin pack. It will be understood that the arrangement depicted is merely an illustrative example and not a required arrangement, orientation, sizing, etc. of the features of computing device 200.

The exhaust vent has a length 220L and a width 220W. Because the height of the end wall is so narrow and in order to make the exhaust vent aesthetically pleasing, the exhaust vent may also be relatively narrow. If the exhaust is narrow, it may also be made longer in order to increase the cross sectional area of the exhaust vent in the end wall. In this example, the cross sectional area of the exhaust vent 220 is equal to the length 220L times the width 220W.

Figure 3A:
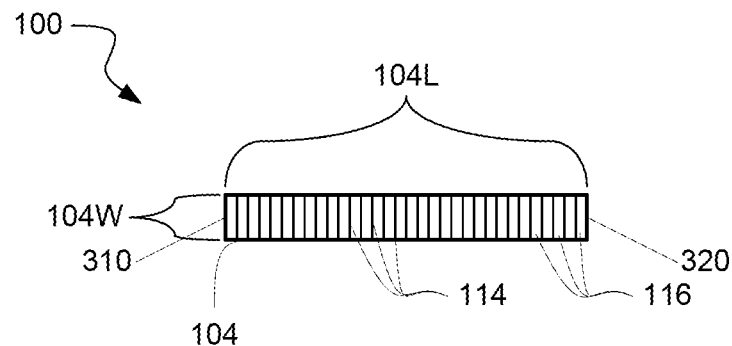
FIGS. 3A and 3B are diagrams of the fin pack of FIG. 1A.
Figure 3B:

FIG. 3A depicts a view of the back end 104 of the fin pack through which air leaves the fin pack. The back end 104 has a length 104L and a width 104W. The back end 104 also includes outer edges 310 and 320 at both sidewalls 110 and 112. The cross sectional area of the exhaust area of the fin pack, or the exit through which the heated air flows, is equal to the length 104L times the width 104W less the area obstructed by fins. Similarly, the exhaust area may be the cross sectional area of all of the spaces 116 between the fins or between a fin and the outer edges. In one example, if the number of spaces is $N_{116}$ and the area of each space is $S_{116}$, the total exhaust area is $N_{116}$ times $S_{116}$. As can be seen from FIG. 3B, in this example, the width of the back end 104 is greater than the width of the exhaust vent 220.

Figure 4:
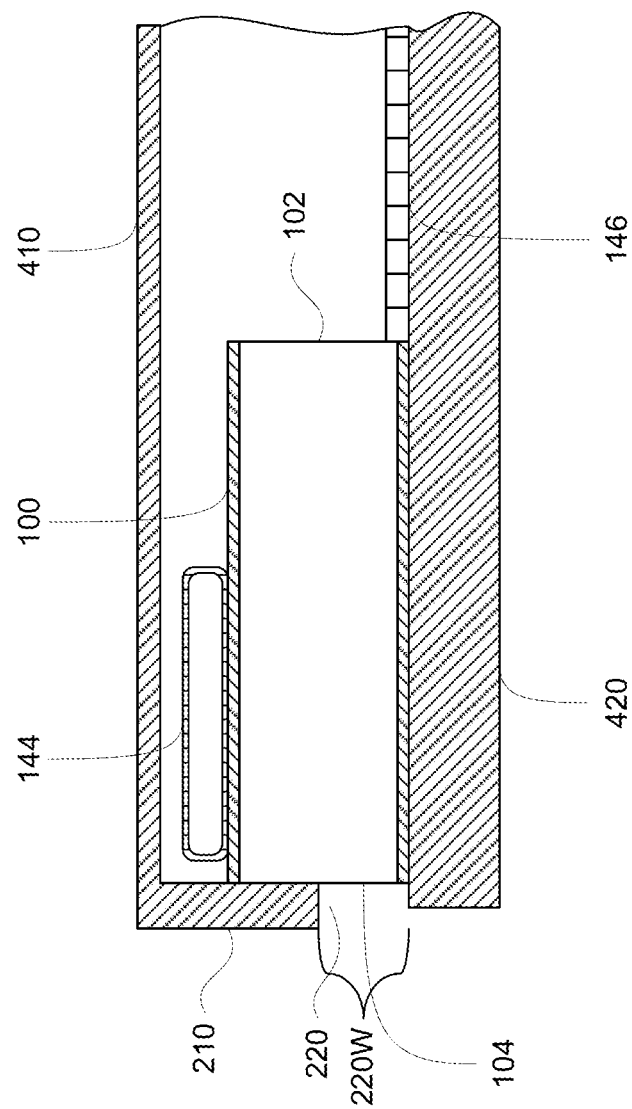
FIG. 4 is a partial cross sectional view of an example computing device in accordance with aspects of the disclosure.

FIG. 4 depicts a side cross sectional view of computing device 200 though the center of the fin pack 100 (see reference line 118 of FIG. 1A). In addition to the end wall 210, the housing of the computing device also includes a top wall 410 and a bottom wall 420. The computing device includes a heat pipe 144 over the fin pack 100 and a fan 146 (in this example, only a portion of the fan housing is depicted) between the top wall 410 and the bottom wall 420. The fin pack 100 is directly adjacent to the end wall 210 and the exhaust vent 220. Because the width of the exhaust vent 220W is smaller than the width of the exit of the fin pack 104W, the fan speed must be increased to move the same amount of air (than if the width of the exit was greater or equal to the width of the exit of the fin pack) through the fin pack and out of the exhaust vent. As noted above, this may require additional power and cause the fan to create more noise.

In order to address these problems, the fin pack may be made narrower, so that the width of the exhaust vent is again equal to the width of the fin pack. However, making the fin pack thinner would reduce the surface area of the fins, cross sectional area of fin pack, and the volume of air which could move through the fin pack. This would again require the fan speed to be increased to move the same amount of heat away from the fins.

Figure 5A:
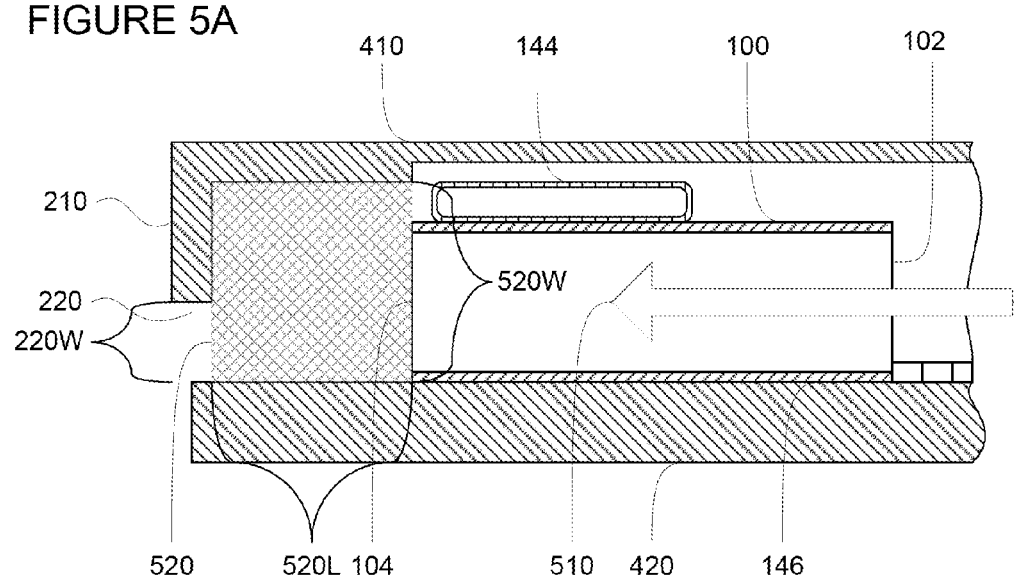
FIG. 5A is another partial cross sectional view of an example computing device in accordance with aspects of the disclosure.

Another way to address these problems may include moving the fin pack away from the end wall of the computing device. For example, FIG. 5A depicts a cross sectional view of computing device 200 through the center of fin pack 100, where fin pack 100 has been moved away from the end wall 210 in the direction of arrow 510. This results in an opening 520 (shown in more detail in FIG. 5B). In this example, the opening is rectangular having a length 520L and a width 520W and a cross sectional area adjacent to the fin pack of the length 520L times the width 520W.

The shape of the cross sectional area of this opening may be determined by the shape of the end wall 210, top wall 410, bottom wall 420, fin pack 100, and the shape of any features between the outer edges of the fin pack and the end wall. Thus, the cross section of the opening may not necessarily be rectangular, however a rectangle is used in the examples herein in order to simplify calculation of the cross sectional areas.

Figure 3C:
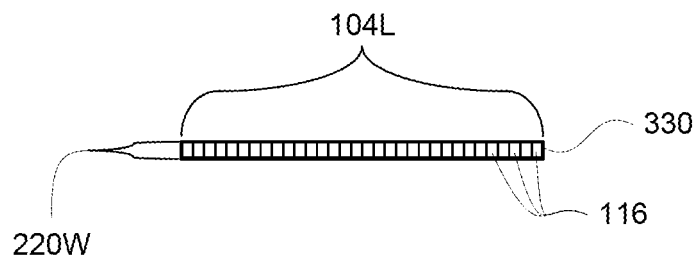
FIG. 3C is a diagram of a usable cross section of an exhaust vent in accordance with aspects of the disclosure.

In order to efficiently move the air through the fin pack and the exhaust vent in the configuration of FIG. 5A, the air must also move efficiently into the spaces 522 and 524 adjacent to the opening 520. To achieve this, the total cross sectional area of the opening between the outer edges of the fin pack and the end wall plus the usable cross sectional area of the exhaust vent may be approximately equal to, equal to, or greater than the exhaust area of the fin pack. For example, the usable cross sectional area of the exhaust vent may be that area of the exhaust vent which is in line with the back end of the fin pack. In other words, if the fin pack was move towards and placed against the end wall and the exhaust vent, the usable area would be the intersection or overlapping of area of the exhaust vent and the exit of the fin pack. For example, returning to the example of FIG. 3B, the usable area of the exhaust vent 220 is the area of the exhaust vent which is in line with the back end 104 of the fin pack or area 330 (shown more clearly in FIG. 3C). In this example, the cross sectional area of area 330 is equal to the width of the exhaust vent times the length of the exit of the fin pack or 104L times 220W.

Figure 5B:
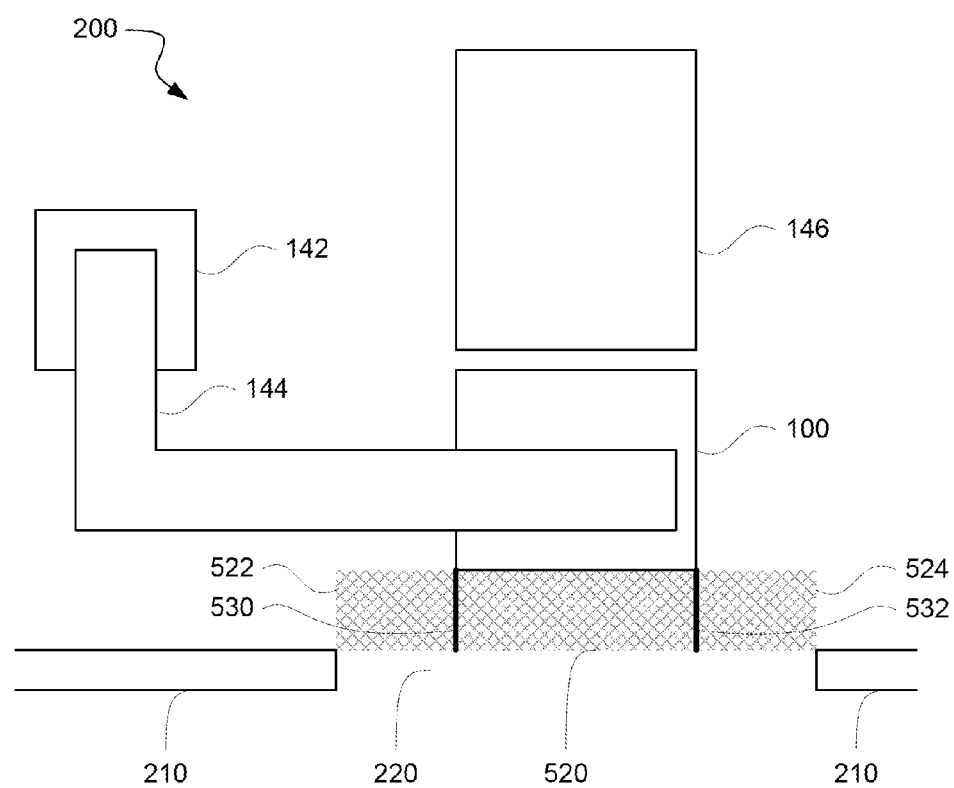
FIG. 5B is a top down partial cross sectional view of the computing device of FIG. 5A.
Figure 5C:
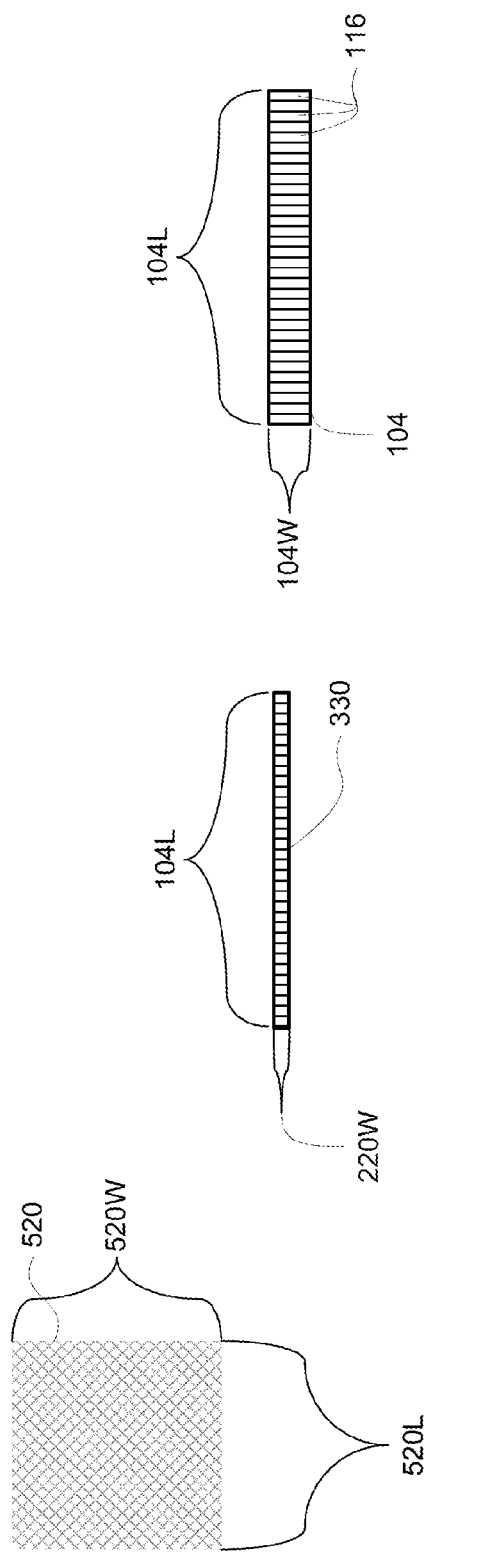
FIG. 5C is a pictorial representation of an equation in accordance with aspects of the disclosure.

For example, FIG. 5B is a top down partial cross sectional view of computing device 200 including fin pack 100 and end wall 210 (with top wall 410 removed). The cross sectional area between the outer edges of the fin pack and end wall 210 may be measured at lines 530 and 532. FIG. 5C depicts a pictorial representation of the calculation described above. For example, the cross sectional areas of the openings at the outer edges (here twice 520L times 520W, because the cross section of the opening measured at lines 530 and 532 is the same) plus the usable cross sectional area of the exhaust vent or area 330 (in this example, 104L times 220W) may be greater than or equal to the exhaust area of the fin pack (in this example, $N_{116}$ times $S_{116}$).

Figure 6:
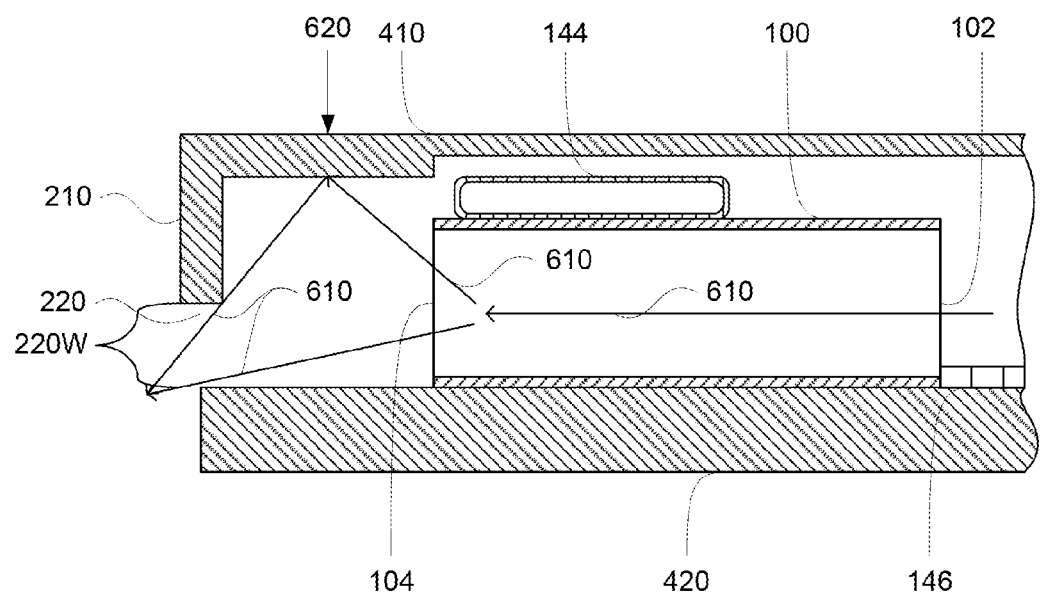
FIG. 6 is another partial cross sectional view of the computing device of FIG. 5A.

With the configuration of FIG. 5A, as air is blown through the fin pack and moves around the opening, a hot spot may be created at the top wall of the computing device adjacent to the center of the exit of the fin pack. FIG. 6 depicts the same cross sectional view of FIG. 5A. In this example, air from the fan is blown through the fin pack in the direction of arrows 610. The air that leaves the fin pack hits the top wall 410 creating a hot spot 620. This hot spot may actually be the hottest area on the computing device's outer surface, even hotter than those areas area of the outer surface above the processor or the heat pipe.

As noted above, in the past, computing devices have included insulators at such hot spots or a heat spreader, such as a graphite sheet, in order to disperse the heat. These options are less efficient and may still result in hot spots.

FIG. 7A is an example of a fin pack 700 that may reduce the likelihood of the hot spot discussed above with regard to FIG.

6. FIG. 7B is a top down view of fin pack 700. The fin pack includes a housing having an entrance 702, an exit 704 (opposite of the entrance), a top wall 706, a bottom wall 708, a first sidewall 710, and a second sidewall 712 (opposite of the first sidewall). Although other configurations of fin packs may be used, in this example, sidewalls 710 and 712 are in parallel planes, and top wall 706 and bottom wall 708 are also in parallel planes. Line 718 (shown in FIGS. 7A and 7B) is a reference line (not necessarily present in the fin pack) depicting the center of fin pack 700.

The fin pack also includes a plurality of fins 714 and spaces 716 between the fins (and at each corner of the front end, between the fins and the sidewalls). In this example, the number of spaces is $N_{716}$ and the area of each space is $S_{716}$, thus, the total exhaust area of fin pack 700 is $N_{716}$ times $S_{716}$. The fins of the fin pack extend from the top wall 706 to the bottom wall 708 and between the front end 702 and the exit 704. In this example, the fins begin at the entrance and terminate at the exit of the fin pack in order to maximize the total surface area of the fins.

During operation, air is blown through the fin pack entering at the entrance and leaving at the exit. The exit 704 has a length 704L and a width 704W. In this example, 704L and 704W are equal to 104L and 104W, respectively. The exit 704 also includes outer edges 722 and 724 at sidewalls 710 and 712, respectively. The cross sectional area of the fin pack at the exit 704 is equal to the length 704L times the width 704W or 104L times 104W. Thus, the usable cross sectional area of exhaust vent 220 is the same as that in the example of FIGS. 3B and 3C or area 330. In this example, like fin pack 100, the width of the back end 704 is greater than the width of the exhaust vent 220.

Fin pack 700 also includes an additional fin or blade 726 that extends the top wall 706. Thus, the blade may be the same thickness as the top wall, but may also be thicker or thinner than the top wall. The blade may also extend some distance past the back end of the fin pack, for example, at least 1 mm or greater. FIG. 7B is a top down view of fin pack 700. Line 728 is an example reference line (not necessarily present in the fin pack) depicting the end of the fins at the exit of the fin pack and the beginning of the blade. In this example, the blade has a generally rectangular configuration having three outer edges 730-732. The outer edges 730 and 732 are parallel to one another and may or may not extend past the parallel planes of the sidewalls 712 and 710.

Figure 8A:
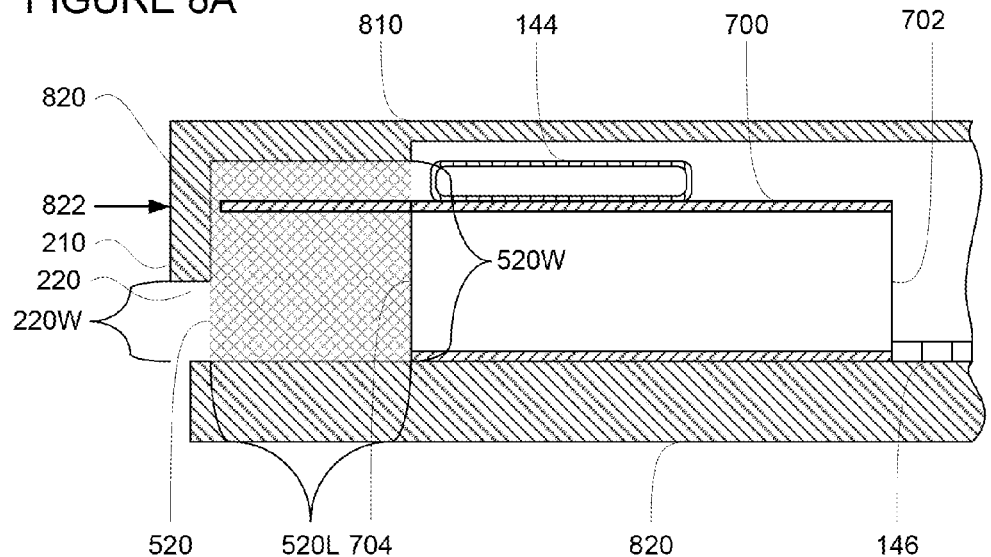
FIG. 8A is another partial cross sectional view of an example computing device in accordance with aspects of the disclosure.
Figure 8B:
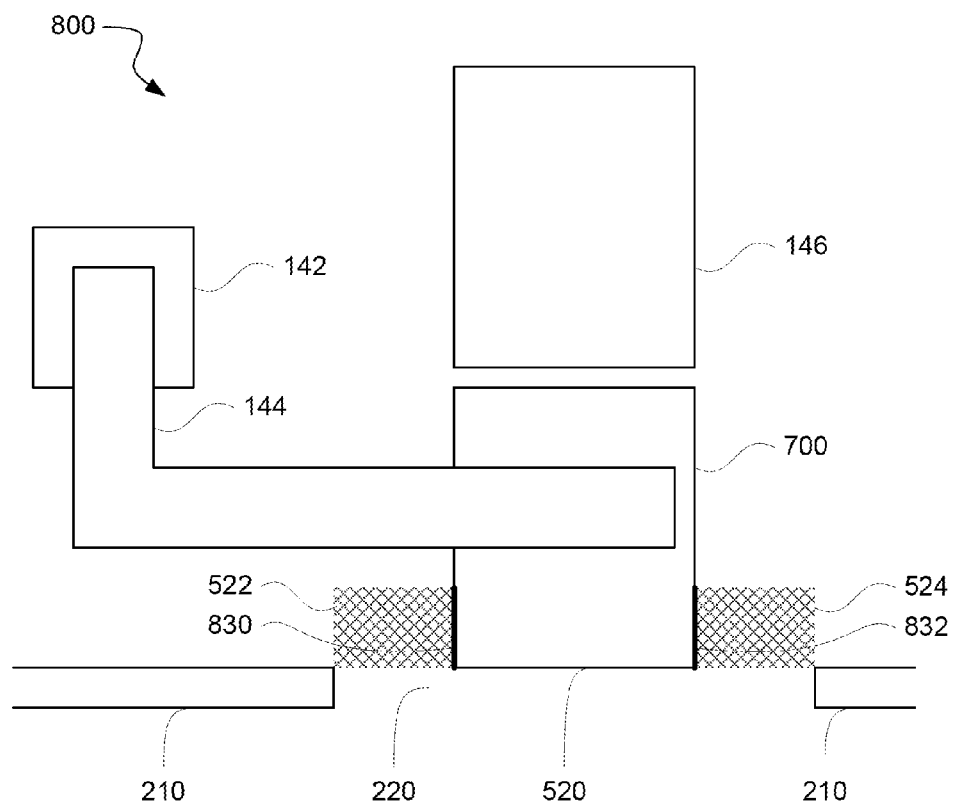
FIG. 8B is a top down partial cross sectional view of the computing device of FIG. 8A.

FIG. 8A depicts a partial cross sectional view of a computing device 800 through the center of fin pack 700 (see reference line 718 of FIGS. 7A and 7B). In this example, computing device 800 includes the same configuration of the end wall 210 and exhaust vent 220 depicted in FIG. 2. Returning to FIG. 8A, in addition to the end wall 210, the housing of the computing device also includes a top wall 810 and a bottom wall 820. The computing device includes a heat pipe 144 over the fin pack 700 and a fan 146 (in this example, only a portion of the fan housing is depicted) between the top wall 810 and the bottom wall 820. The computing device 800 also includes an opening 520 (as shown in FIGS. 5A and 5B) between the exit 704 of the fin pack 700 and the end wall 210. As shown in FIGS. 8A and 8B, the fin pack 700 is positioned such that the exit 704 is oriented towards the end wall 210 and the blade 726 (of FIG. 7A) is at least partially in the opening 520. There may also be a gap 820 between the blade and the end wall 210. This gap may be fairly small, for example, on the order of 0.5 mm or smaller, or somewhat larger. The gap 820 may prevent another hotspot from forming on an outer surface 822 of the end wall 210.

As described above, in order to efficiently move the air through the fin pack and the exhaust vent in the configuration of FIG. 8A, the air must also move efficiently into the spaces 522 and 524 adjacent to the opening 520 (see FIG. 8B). To achieve this, the total cross sectional area of the opening between the outer edges of the fin pack and the end wall plus the usable cross sectional area of the exhaust vent may be approximately equal to, equal to, or greater than the cross sectional area of the exit of the fin pack. The cross sectional area between the outer edges 722 and 724 of fin pack 700 and the end wall 210 may be measured at lines 830 and 832, respectively, of FIG. 8B.

Figure 8C:
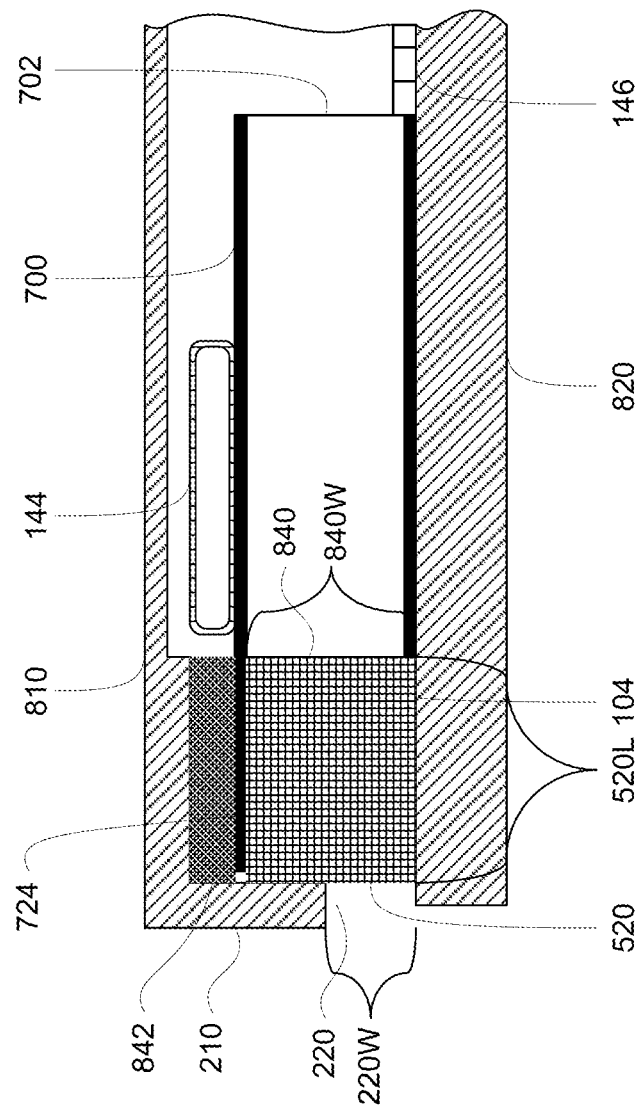
FIG. 8C is another partial cross sectional view of the example computing device of FIG. 8A.

FIG. 8C depicts a partial cross sectional view of computing device 800 through line 832. In this example, the cross sectional area 520 is broken up, interfered with, or otherwise occluded by the outer edge 732 of the blade 726. Thus, the blade 726 sections the opening 520 into two spaces, 840 and 842. In this example, space 840 includes a length 520L and a width 840W. Thus, the cross sectional area between the outer edge 724 of fin pack 700 and the end wall 210 is that of space 840 or 520L times 840W.

Figure 8D:
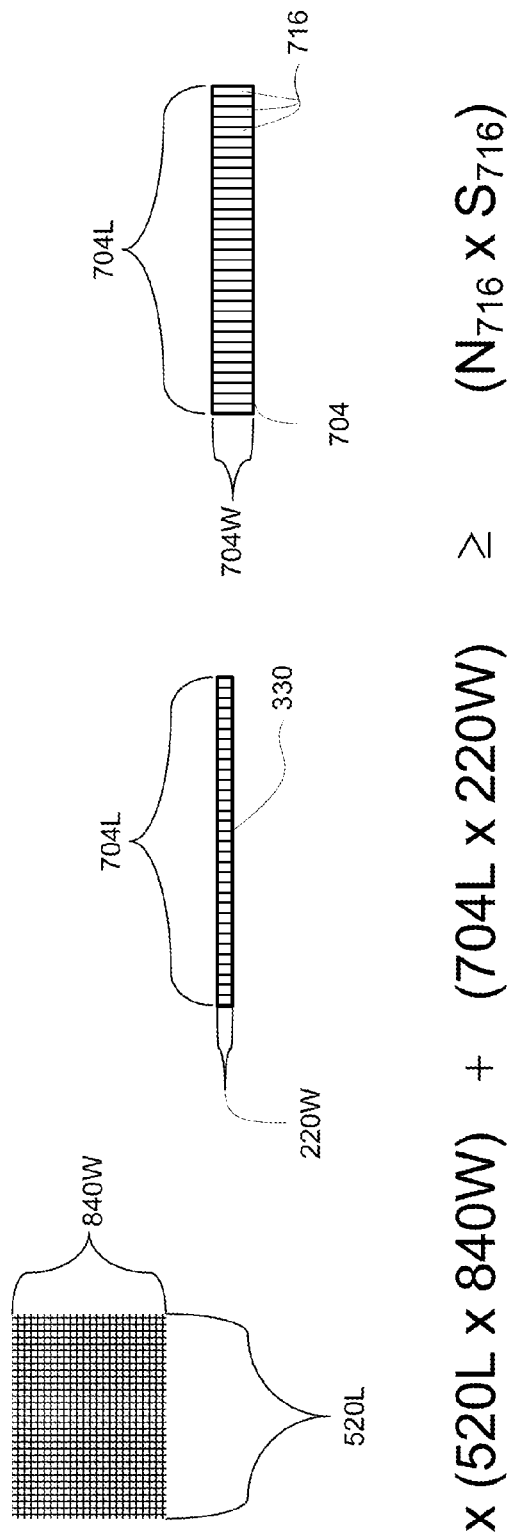
FIG. 8D is a pictorial representation of an equation in accordance with aspects of the disclosure.

FIG. 8D depicts a pictorial representation of the calculation described above. For example, the cross sectional areas of the openings at each of the outer edges (here twice 520L times 840W, because the cross section of the opening measured at lines 830 and 832 is the same) plus the usable cross sectional area of the exhaust vent or area 330 (in this example, 704L times 220W) must be greater than or equal to the exhaust area of the fin pack (in this example, $N_{716}$ times $S_{716}$).

With the configuration of FIG. 8A, as air is blown through the fin pack and moves around the opening 520, the blade 726 may prevent a hot spot from being created at the top wall of the computing device adjacent to the center of the exit of the fin pack. The blade 726 may also provide additional surface area for moving heat away from the heat pipe and passing it to the air from the fan. This causes more heat to be removed from the device, resulting in a fin pack which is more efficient than the typical fin packs, such as fin pack 100, described above.

Figure 9A:
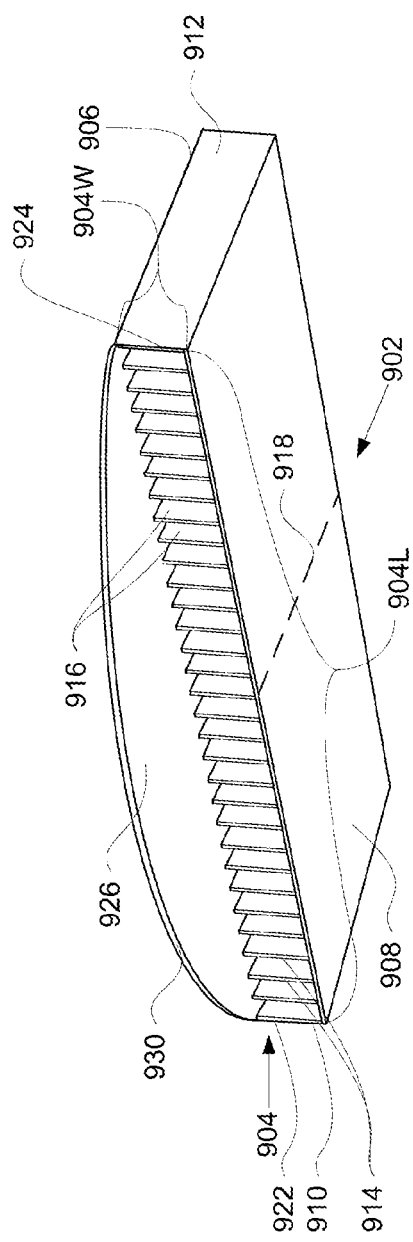
FIGS. 9A and 9B are example diagrams of a fin pack in accordance with aspects of the disclosure.
Figure 9B:
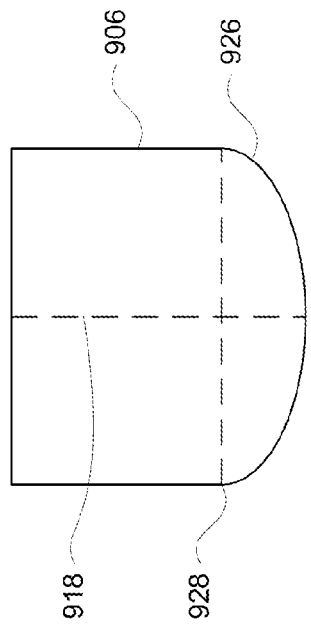

FIG. 9A is an example of a fin pack 900 that also reduces the hot spot discussed above with regard to FIG. 6. FIG. 9B is a top down view of fin pack 900. The fin pack includes a housing having a front end 902, an exit 904 (opposite of the entrance), a top wall 906, a bottom wall 908, a first sidewall 910, and a second sidewall 912 (opposite of the first sidewall). Although other configurations of fin packs may be used, in this example, sidewalls 910 and 912 are in parallel planes, and top wall 906 and bottom wall 908 are also in parallel planes. Line 918 (shown in FIGS. 9A and 9B) is a reference line (not necessarily present in the fin pack) depicting the center of fin pack 900.

The fin pack also includes a plurality of fins 914 and spaces 916 between the fins (and at each corner of the front end, between the fins and the sidewalls). In this example, the number of spaces is $N_{916}$ and the area of each space is $S_{916}$, thus, the total exhaust area of fin pack 900 is $N_{916}$ times $S_{916}$. The fins of the fin pack extend from the top wall 906 to the bottom wall 908 and between the front end 902 and the exit 904. In this example, the fins begin at the entrance and terminate at the exit of the fin pack in order to maximize the total surface area of the fins.

During operation, air is blown through the fin pack entering at the entrance and leaving at the exit. The exit 904 has a length 904L and a width 904W. In this example, 904L and 904W are equal to 104L and 104W (see FIG. 3A), respectively. The exit 904 also includes outer edges 922 and 924 at sidewalls 910 and 912, respectively. The cross sectional area of the fin pack at the exit 904 is equal to the length 904L times the width 904W or 104L times 104W. Thus, the usable cross sectional area of exhaust vent 220 is the same as that in the example of FIGS. 3B and 3C or area 330. In this example, like fin pack 100, the width of the back end 904 is greater than the width of the exhaust vent 220.

Fin pack 900 also includes an additional fin or blade 926 that extends the top wall 906. Again, the blade may be the same thickness as the top wall, but may also be thicker or thinner than the top wall. The blade 926 may also extend some distance past the back end of the fin pack, for example, at least 1 mm or greater. FIG. 9B is a top down view of fin pack 900. Line 928 is an example reference line (not necessarily present in the fin pack) depicting the end of the fins at the exit of the fin pack and the beginning of the blade. In this example, the blade has a generally arced-shaped configuration having one edge 930 which forms a curve between the outer edges 922 and 924 at the top wall 906 of the fin pack 900. The edge 930 of the curve may or may not extend past the parallel planes of the sidewalls 912 and 910.

Figure 10A:
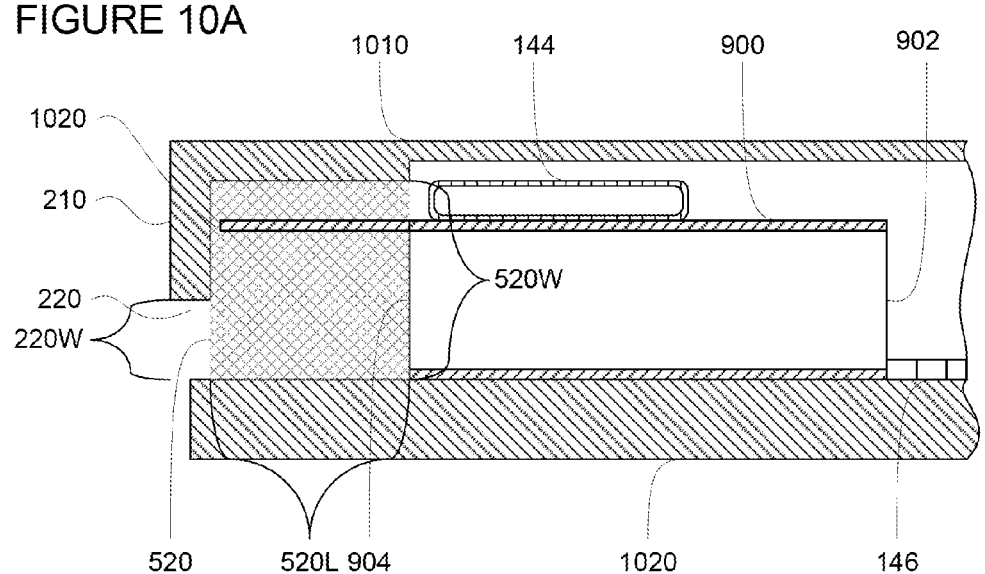
FIG. 10A is another partial cross sectional view of an example computing device in accordance with aspects of the disclosure.

FIG. 10A depicts a partial cross sectional view of a computing device 1000 through the center of fin pack 900 (see reference line 918 of FIG. 9). In the example of FIG. 10A, computing device 1000 includes the same configuration of the end wall 210 and exhaust vent 220 of FIG. 2. In addition to the end wall 210, the housing of computing device 1000 also includes a top wall 1010 and a bottom wall 1020. The computing device includes a heat pipe 144 over the fin pack 900 and a fan 146 (in this example, only a portion of the fan housing is depicted) between top wall 1010 and bottom wall 1020. The computing device 1000 also includes an opening 520 (similar to opening 520 of FIGS. 5A and 5B) between the exit 904 of the fin pack 900 and the end wall 210. As shown in the example of FIG. 10A, the fin pack 900 is positioned such that the exit 904 is oriented towards the end wall 210 and the blade 926 is at least partially in the opening 520. There may also be a gap 1020 between the blade and the end wall 210. This gap may be fairly small, for example, on the order of 0.5 mm or smaller, or somewhat larger. The gap 1020 may prevent another hotspot from forming on an outer surface 1022 of the end wall 210.

Figure 10B:
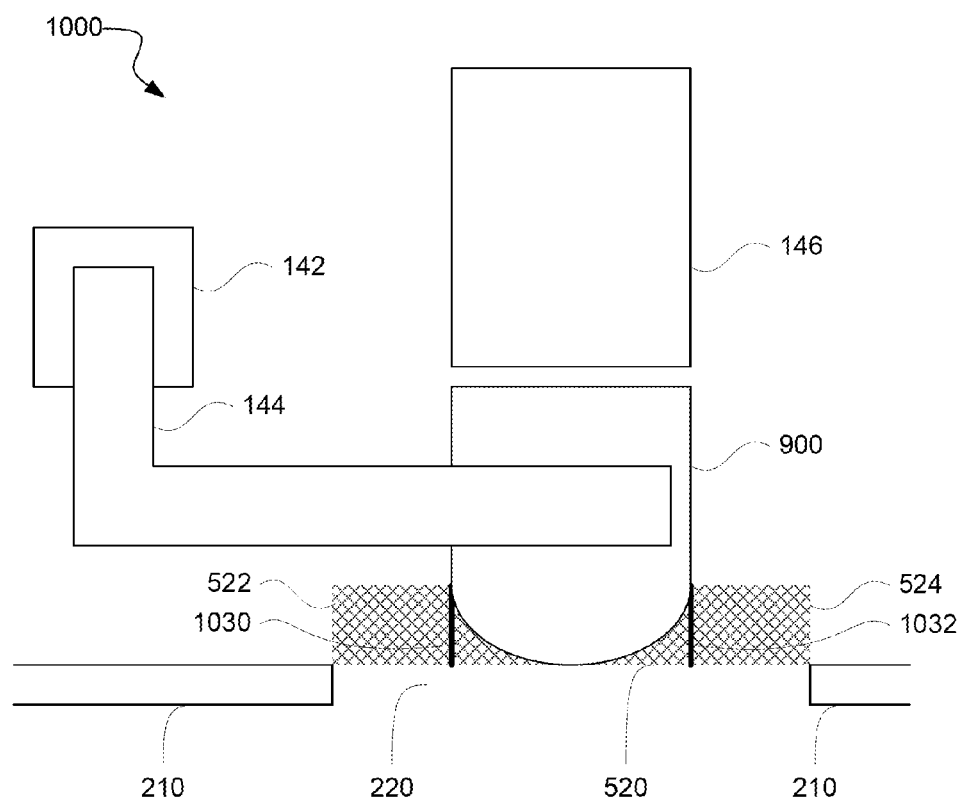
FIG. 10B is a top down partial cross sectional view of the computing device of FIG. 10A.

Again, in order to efficiently move the air through the fin pack and the exhaust vent in the configuration of FIG. 10A, the air must also move efficiently into the spaces 522 and 524 adjacent to the opening 520 shown in FIG. 10B. To achieve this, the total cross sectional area of the opening between the outer edges of the fin pack and the end wall plus the usable cross sectional area of the exhaust vent may be approximately equal to, equal to, or greater than the cross sectional area of the exit of the fin pack. The cross sectional area between the outer edges 922 and 924 of fin pack 900 and the end wall 200 is measured at lines 1030 and 1032, respectively, of FIG. 10B.

Figure 10C:
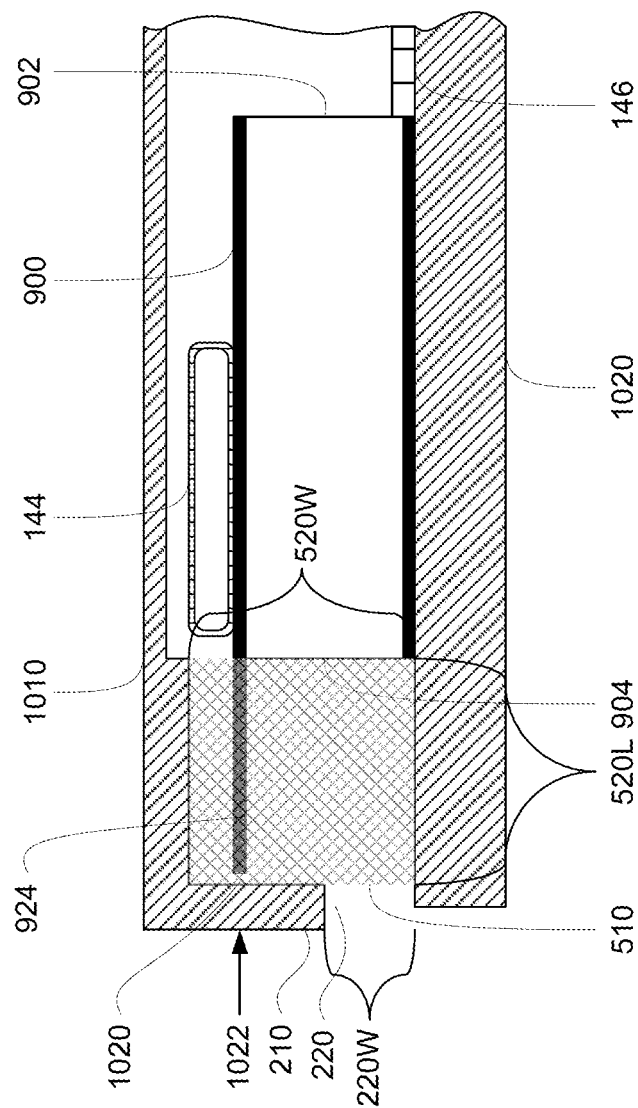
FIG. 10C is another partial cross sectional view of the example computing device of FIG. 10A.

FIG. 10C depicts a partial cross sectional view of computing device 1000 through line 1032. Unlike in the example of FIG. 8C, the cross sectional area 520 of FIG. 10C is not broken up by, interfered with, or otherwise occluded by the outer edge 930 of the blade 926. Thus, the cross sectional area between the outer edge 924 of fin pack 900 and the end wall 210 is that of opening 520 or 520L times 520W. Because of the curved shape, the cross sectional area at the outer edge 924 is actually greater than the cross sectional area at the outer edge 724 of FIG. 7C.

Figure 10D:
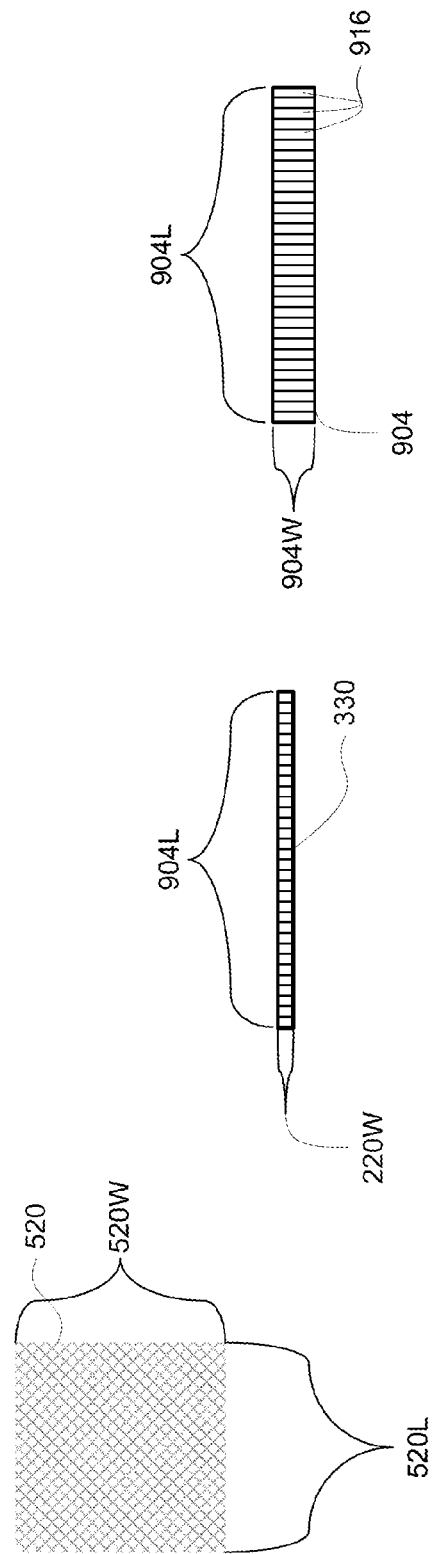
FIG. 10D is a pictorial representation of an equation in accordance with aspects of the disclosure.

FIG. 10D depicts a pictorial representation of the calculation described above for fin pack 900 and the configuration of FIG. 9A. For example, cross sectional areas of the openings at each of the outer edges (here twice 520L times 520W, because the cross section of the opening measured at lines 1032 and 1034 is the same) plus the usable cross sectional area of the exhaust vent 220 (in this example, 904L times 220W) must be greater than or equal to the exhaust area of the fin pack (in this example, $N_{916}$ times $S_{916}$).

With the configuration of FIG. 10A, as air is blown through the fin pack and moves around the opening 520, the blade 926 may prevent a hot spot from being created at the top wall of the computing device adjacent to the center of the exit of the fin pack. The blade 926 may also provide additional surface area for moving heat away from the heat pipe and passing it to the air from the fan. This causes more heat to be removed from the device, resulting in a fin pack which is more efficient than the typical fin packs, such as fin pack 100, described above. In addition, the curved shape of blade 926 may allow air to move upwards at the outer edges 922 and 924 giving the space between the outer edges and the end wall of the computing device a greater cross sectional area than that of a rectangular shaped blade. In other words, in order to satisfy the equations of FIGS. 8D and 10D, a greater distance (520L) would be needed between fin pack 700 and the end wall 210 than fin pack 900 and the end wall 210 in order to maximize the efficiency of the system.

The arrangements of the blades described herein are exemplary. In addition to generally rectangular and arced shaped blades other shapes may also satisfy the equations described above and prevent hot spots from forming on the housing of a computing device as described herein.

The fin packs described herein may be made of various metals or other heat conducting materials. For example, the housing and fins may be formed of a metal (including alloys) with a low thermal resistance in order to conduct the heat down or along the fins as described above.

As these and other variations and combinations of the features discussed above can be utilized without departing from the subject matter defined by the claims, the foregoing description of the embodiments should be taken by way of illustration rather than by way of limitation of the subject matter defined by the claims. It will also be understood that the provision of the examples disclosed herein (as well as clauses phrased as "such as," "including" and the like) should not be interpreted as limiting the claimed subject matter to the specific examples; rather, the examples are intended to illustrate only one of many possible embodiments. Further, the same reference numbers in different drawings may identify the same or similar elements.

The invention claimed is:

1. A device comprising:
   a device housing having a top wall and an end wall adjacent to the top wall, the end wall including an exhaust vent for allowing exhaust air to leave the housing;
   a fin pack including:
   a fin pack housing having four sidewalls, including a first sidewall opposite a second sidewall, a third sidewall between the first and second sidewalls, the third sidewall being opposite a fourth sidewall, the fourth sidewall between the first and second sidewalls;
   a set of fins extending from the first sidewall towards the second sidewall, the set of fins being arranged between the third and fourth sidewalls;
   an entrance at a first end of the fin pack housing and an exit at a second end of the housing opposite the entrance, the exit being oriented towards the exhaust vent and spaced a predetermined distance from the exhaust vent, the pre-determined distance from the exhaust vent is such that an equation, a+b≥c is satisfied, where a is a total cross sectional area of the exhaust vent between an outer edge of the fin pack and the end wall, where b is a usable cross sectional area of the exhaust vent, and where c is a total cross sectional exhaust area of the fin pack, wherein the fins begin at the entrance and terminate at the exit such that during operation of the fin pack, air flows into the fin pack at the entrance, through the fins, and out of the fin pack at the exit; and a blade extending from the first sidewall past the exit and towards the exhaust vent and from the third sidewall to the fourth sidewall, the blade having a generally rectangular shape with three exposed edges all in a same plane as the first sidewall;

wherein the fin pack is positioned in the device housing to allow heat generated by a processor to move through the fin pack from the entrance through the fins and out the exit; and wherein the blade is configured to prevent a hot spot from forming on the top wall along a second plane through a center line of the fin pack.

2. The device of claim 1, wherein the blade extends at least 1 mm past the exit of the fin pack.

3. The device of claim 1, wherein the blade is in a third plane that is generally perpendicular to a fourth plane of a fin of the fin pack.

4. The device of claim 1, wherein two of the exposed edges are parallel, a first one of the parallel exposed edges does not extend past a plane of the third sidewall, and a second one of the parallel exposed edges does not extend past a plane of the fourth sidewall.

5. The device of claim 1, wherein the blade is configured to provide additional surface area for distributing the heat to air blown through the exit of the fin pack.

6. The device of claim 1, wherein the fin pack is arranged in the housing such that there is a gap of at least 0.5 mm between one of the exposed edges of the blade and the end wall.

7. The device of claim 1, wherein the fin pack is arranged in the housing such that there is a gap of at least 0.5 mm between the exposed edge of the blade and the end wall.

8. The device of claim 1, wherein each of the first sidewall, the second sidewall, the third sidewall, and the fourth sidewall are free of openings.

* * * * *